(12) United States Patent
Derraa et al.

(10) Patent No.: US 6,696,368 B2
(45) Date of Patent: Feb. 24, 2004

(54) TITANIUM BORONITRIDE LAYER FOR HIGH ASPECT RATIO SEMICONDUCTOR DEVICES

(75) Inventors: Ammar Derraa, Boise, ID (US); Sujit Sharan, Chandler, AZ (US); Paul Castrovillo, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/918,919

(22) Filed: Jul. 31, 2001

(65) Prior Publication Data

US 2003/0025206 A1 Feb. 6, 2003

(51) Int. Cl.⁷ .................. H01L 21/31; H01L 21/469
(52) U.S. Cl. .................. 438/761; 438/597; 438/595; 438/599; 438/627; 438/639
(58) Field of Search .................. 438/761, 758, 438/759, 763, 584, 597, 627, 595, 599, 639, 648, 683, 685

(56) References Cited

U.S. PATENT DOCUMENTS

| | | | |
|---|---|---|---|
| 5,700,716 A | 12/1997 | Sharan et al. | 437/190 |
| 5,747,116 A | 5/1998 | Sharan et al. | 427/534 |
| 5,851,680 A * | 12/1998 | Heau | 428/472 |
| 5,908,947 A | 6/1999 | Vaartstra | 556/42 |
| 5,946,594 A | 8/1999 | Iyer et al. | 438/648 |
| 5,976,976 A | 11/1999 | Doan et al. | 438/683 |
| 5,977,636 A | 11/1999 | Sharan | 257/763 |
| 5,990,021 A | 11/1999 | Prall et al. | 438/745 |
| 6,037,252 A | 3/2000 | Hillman et al. | 438/637 |
| 6,054,191 A | 4/2000 | Sharan et al. | 427/534 |
| 6,086,442 A | 7/2000 | Sandhu et al. | 445/24 |
| 6,156,638 A | 12/2000 | Agarwal et al. | 438/627 |
| 6,184,135 B1 * | 2/2001 | Ku | 438/683 |
| 6,200,649 B1 * | 3/2001 | Dearnaley | 427/530 |
| 6,329,670 B1 | 12/2001 | Hu | 257/48 |
| 6,511,900 B2 | 1/2003 | Agarwal et al. | 438/592 |
| 2001/0002071 A1 | 5/2001 | Agarwal et al. | 257/751 |
| 2001/0030235 A1 | 10/2001 | Hedemann et al. | 235/451 |
| 2001/0030552 A1 * | 10/2001 | Hu | 324/763 |
| 2002/0001908 A1 | 1/2002 | Agarwal et al. | 438/300 |

FOREIGN PATENT DOCUMENTS

| JP | 05267220 | 10/1993 | H01L/21/285 |
|---|---|---|---|
| JP | 09306870 | 11/1997 | H01L/21/285 |

* cited by examiner

*Primary Examiner*—Craig A. Thompson
(74) *Attorney, Agent, or Firm*—Whyte Hirschboeck Dudek SC

(57) ABSTRACT

Conductive contacts in a semiconductor structure, and methods for forming the conductive components are provided. The contacts are useful for providing electrical connection to active components beneath an insulation layer in integrated circuits such as memory devices. The conductive contacts comprise boron-doped $TiCl_4$-based titanium nitride, and possess a sufficient level adhesion to the insulative layer to eliminate peeling from the sidewalls of the contact opening and cracking of the insulative layer when formed to a thickness of greater than about 200 angstroms.

120 Claims, 6 Drawing Sheets

TITANIUM BORONITRIDE LAYER FOR HIGH ASPECT RATIO SEMICONDUCTOR DEVICES

FIELD OF THE INVENTION

The present invention relates to the field of semiconductor device fabrication, and more particularly to methods for making conductive contacts in the formation of a semiconductor device.

BACKGROUND OF THE INVENTION

As semiconductor fabrication moves toward maximizing circuit density, electrical components are formed at a number of layers and different locations. This requires electrical connection between metal layers or other conductive layers at different elevations in the substrate. Such interconnections are typically provided by forming a contact opening through insulating layer to the underlying conductive feature. With increasing circuit density, the dimensions of openings for electrical contacts become narrower and deeper, posing a challenge to provide adequate conductive fill within high aspect ratio openings.

Typically, in forming a contact plug, a thin layer of titanium is deposited over the top of a silicon base layer (substrate), and tungsten or other electrically conductive plug material is then deposited from tungsten hexafluoride ($WF_6$) by chemical vapor deposition (CVD) to fill the contact hole. However, there are several limitations of tungsten (W) plugs. Tungsten does not provide an adequate fill for high aspect ratio features. In addition, the use of $WF_6$ as a precursor gas in the formation of tungsten plugs, can result in the penetration of the fluoride component into the adjacent dielectric layer causing lateral encroachment and wormholes.

Titanium nitride (TiN) films have attractive properties that may overcome the limitations of tungsten plugs as integrated circuit (IC) devices continue to shrink below 0.15 micron dimension. TiN films have been deposited by low pressure chemical vapor deposition (LPCVD) using tetrakisdimethyl-amidotitanium (TDMAT) and ammonia as precursor gases. However, TDMAT films have a high carbon content and when subjected to high temperatures in the presence of oxygen, become porous and, therefore, are unusable as a conductive contact.

Thin TiN films and liners have also been deposited from titanium tetrachloride ($TiCl_4$) and ammonia ($NH_3$) by CVD onto a titanium (Ti) liner overlying the insulative layer. Although useful for forming a thin liner, when pure $TiCl_4$-based TiN is deposited to fill a via or other contact opening, the material does not adhere well to the Ti thin layer, particularly when the TiN layer becomes greater than about 150 to about 200 angstroms thick.

Therefore, it would be desirable to provide a titanium nitride material that can be used as a replacement fill material for tungsten in forming conductive contacts in high aspect ratio features in a semiconductor device.

SUMMARY OF THE INVENTION

The present invention provides methods for forming conductive contacts in the construction of semiconductive devices, and the conductive components formed by those methods. The method is useful for fabricating contacts to electrical components beneath an insulation layer in an integrated circuit such as memory devices.

The present $TiCl_4$-based titanium nitride films are particularly useful as conductive contacts to replace tungsten (W) plugs in high aspect ratio features, particularly openings and other features having an aspect ratio of 3:1 or greater. The films also overcome inadequacies of pure $TiCl_4$-based titanium nitride films that are used as fill material for forming conductive contacts or interconnects within contact openings formed through an insulative layer of a semiconductor structure. Pure $TiCl_4$-based titanium nitride fills do not adhere well to the surface of insulative sidewalls of a contact opening, and can also cause the insulative layer to crack due, at least in part, to the pressure exerted when the thickness of the fill within the contact opening is about 200 angstroms or greater.

The present invention overcomes the problems of a pure $TiCl_4$-based titanium nitride plugs or barrier film by incorporating diborane ($B_2H_6$) into the gas mixture to dope the $TiCl_4$-based titanium nitride film during the deposition process. The addition of $B_2H_6$ to the precursor gas used to form the $TiCl_4$-based titanium nitride film has been found to improve the mechanical properties of the resulting titanium nitride film with substantially no impact on its conductive properties. In particular, the gaseous mixture used to form the boron-doped, titanium nitride contacts comprises diborane ($B_2H_6$) in an amount effective to provide a contact having an amount of boron to provide a level of adhesion of the conductive contact to the insulative sidewalls of the contact opening to substantially eliminate peeling of the contact from the sidewalls and cracking of the body of the insulative layer. The mixture further includes an amount of ammonia ($NH_3$) to provide the contact with a level of nitrogen effective to maintain the conductivity of the contact at a predetermined level for an effective electrical contact with a conductive or active area within the substrate to/from an active area within a semiconductor device and/or a memory or logic array.

In one aspect, the invention provides methods for forming a titanium nitride conductive contact in a via or other contact opening of a semiconductor structure. The opening is formed through an insulative layer to a conductive area, such as a source/drain region, in an underlying silicon substrate. The method is particularly useful for forming conductive contacts within vias and other openings having an aspect ratio of about 3:1 or greater, and a width dimension of about 0.25 μm or less.

According to one embodiment of the method of the invention, a titanium nitride conductive contact is formed by first depositing a seed layer comprising titanium silicide ($TiSi_x$) over the silicon substrate at the bottom of the contact opening, preferably to a thickness of about 250 to about 300 angstroms. Preferably, the $TiSi_x$ seed layer is deposited from titanium tetrachloride ($TiCl_4$) and hydrogen ($H_2$) by plasma-enhanced chemical vapor deposition (PECVD).

A boron-doped titanium nitride film (i.e., titanium boronitride, $TiB_xN_y$) is then deposited onto the seed layer to fill the contact opening, typically to a thickness of about 1000 to about 3000 angstroms. Preferably, the $TiB_xN_y$ layer is deposited from a gas mixture of $TiCl_4$, $NH_3$, $B_2H_6$, and one or more carrier gases, by thermal CVD at a pressure of about 1 to about 15 Torr and a temperature of about 550 to about 700° C. The substrate can then be processed to remove excess material, for example, by chemical-mechanical polishing, to form the conductive contact in the opening.

In another embodiment of the method of the invention, a multi-layered titanium nitride conductive contact is formed within a contact opening of a semiconductive structure. A titanium silicide seed layer is first formed over the silicon substrate at the bottom of the contact opening. To form the layered contact, alternating layers of titanium nitride and boron-doped titanium nitride are then deposited over the seed layer. In forming the alternating layers, a layer comprising titanium nitride (undoped) can be deposited from a first gaseous mixture comprising $TiCl_4$ and $NH_3$, to form a layer typically about 100 to about 500 angstroms thick. Diborane ($B_2H_6$) can then be introduced into the gaseous mixture to deposit an intermediate layer of boron-doped titanium nitride to form a layer typically about 100 to about 500 angstroms thick. The flow of diborane into the gas mixture can then be stopped to deposit a next layer of titanium nitride layer that is not doped to a typical thickness of about 100 to about 500 angstroms. Additional alternating layers of doped and undoped titanium nitride can be deposited to fill the opening, with the uppermost layer being undoped titanium nitride.

Another aspect of the invention is a conductive contact formed in a semiconductor structure of a semiconductor circuit. The semiconductor structure comprises a silicon substrate, an overlying insulative layer, a contact opening formed through the insulative layer to expose the underlying silicon substrate, and the conductive contact formed within the opening.

In one embodiment of the conductive contact according to the invention, the contact comprises a layer of boron-doped titanium nitride overlying a thin titanium silicide layer formed on the substrate at the bottom of the opening.

In another embodiment, the conductive contact comprises multiple layers of titanium nitride overlying a thin titanium silicide layer deposited onto the silicon substrate at the bottom of the contact opening. The contact comprises alternating, overlying layers of undoped and boron-doped titanium nitride that fill the contact opening. An undoped titanium nitride layer overlies the titanium silicide layer, and also forms the uppermost layer of the conductive contact. The thickness of each of the individual layers is typically about 100 to about 500 angstroms.

Another aspect of the invention is an integrated circuit (IC) device that includes the foregoing conductive contacts comprising boron-doped titanium nitride. The IC device comprises an array of memory or logic cells, internal circuitry, and at least one generally vertical conductive contact coupled to the cell array and internal circuitry.

In one embodiment of an integrated circuit device according to the invention, the IC device comprises a conductive contact of boron-doped titanium nitride that is formed within an insulative contact opening over a thin layer of titanium silicide deposited onto the exposed substrate at the bottom of a contact opening. In another embodiment of an integrated circuit device, the conductive contact is multi-layered and comprises alternating layers of titanium nitride (undoped) and boron-doped titanium nitride deposited onto a titanium silicide layer overlying the substrate at the bottom of a contact opening. The contact is in electrical contact with a conductive area or active area such as a source/drain region of a transistor or a memory or logic cell array, or other semiconductor device.

Advantageously, the present film overcomes limitations of tungsten plug fills in high aspect ratio devices, with parametric data showing superior results compared to that of tungsten. The present invention provides processes for forming conductive contacts that are fast, simple and inexpensive to implement in semiconductor manufacturing.

BRIEF DESCRIPTION OF THE DRAWINGS

Preferred embodiments of the invention are described below with reference to the following accompanying drawings, which are for illustrative purposes only. Throughout the following views, the reference numerals will be used in the drawings, and the same reference numerals will be used throughout the several views and in the description to indicate the same or like parts.

DETAILED DESCRIPTION OF THE PREFERRED EMBODIMENTS

The present invention encompasses methods of making integrated circuits, particularly methods for forming conductive contacts for providing electrical connection between conductive or active areas of discrete semiconductor devices or portions of such devices. In particular, the invention relates to a contact structure incorporating a boron-doped titanium nitride film. The present invention is particularly useful in providing a conductive contact in openings and other features having a high aspect ratio of 3:1 or greater.

The invention will be described generally with reference to the drawings for the purpose of illustrating the present preferred embodiments only and not for purposes of limiting the same. The figures illustrate processing steps for use in the fabrication of semiconductor devices in accordance with the present invention. It should be readily apparent that the processing steps are only a portion of the entire fabrication process.

Integrated circuits include a large number of electronic semiconductor devices that are formed on varying levels of a semiconductor substrate. Exemplary semiconductor devices include capacitors, resistors, transistors, diodes, and the like. In manufacturing an integrated circuit, the discrete semiconductor devices that are located on nonadjacent structural levels are electrically connected, for example with an interconnect or conductive contact structure. The conductive contact generally comprises a region of conducting material that is formed between the semiconductor devices or portions of the semiconductor devices that are being placed in electrical communication. The conductive contact serves as a conduit for delivering electrical current between the semiconductor devices. Specific types of conductive contact structures include local interconnects, contacts, buried contacts, vias, plugs, and filled trenches. The present invention particularly deals with the method of making conductive contacts that are used in the fabrication of semiconductor devices.

In the current application, the terms "semiconductive wafer fragment" or "wafer fragment" or "wafer" will be understood to mean any construction comprising semiconductor material, including but not limited to bulk semiconductive materials such as a semiconductor wafer (either alone or in assemblies comprising other materials thereon), and semiconductive material layers (either alone or in assemblies comprising other materials). The term "substrate" refers to any supporting structure including, but not limited to, the semiconductive wafer fragments or wafers described above.

A first embodiment of a method of the present invention is described with reference to FIGS. 1A through 1D, in a method of forming a conductive contact 34. The contact is illustrated and will be described as being coupled to a diffusion region; however, the contacts of the present invention can be used wherever required within the structure of a semiconductor circuit.

Figure 1A:
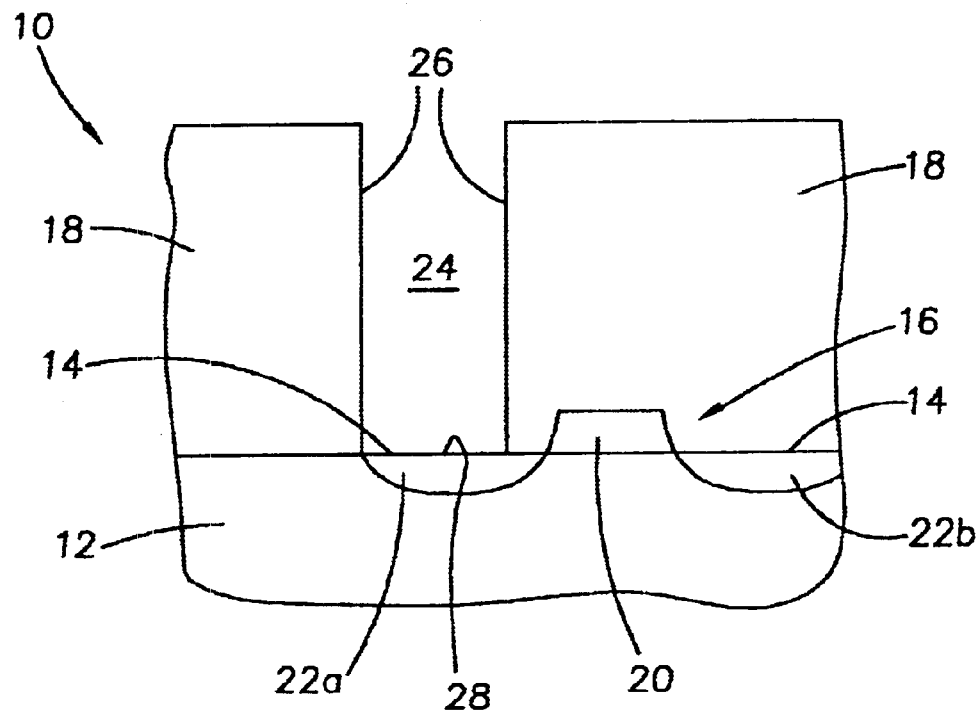
FIG. 1A is a diagrammatic cross-sectional view of a semiconductor wafer fragment at a preliminary step of a processing sequence.

Referring to FIG. 1A, a semiconductive wafer fragment 10 is shown at a preliminary processing step. The wafer fragment 10 in progress can comprise a semiconductor wafer substrate or the wafer along with various process layers formed thereon, including one or more semiconductor layers or other formations, and active or operable portions of semiconductor devices.

The wafer fragment 10 is shown as including a silicon-comprising base layer or substrate 12. An exemplary substrate 12 is monocrystalline silicon that is typically lightly doped with a conductivity enhancing material. Formed at the surface 14 of the substrate 12 are a transistor structure 16 and an overlying insulative layer 18. The transistor 16, comprising a gate 20 and adjacent source/drain diffusion regions 22a, 22b, can be formed by conventional methods known and used in the art.

The insulative layer 18 comprises an oxide, for example, silicon dioxide ($SiO_2$), phosphosilicate glass (PSG), borosilicate glass (BSG), and borophosphosilicate glass (BPSG), in a single layer or multiple layers, being BPSG in the illustrated embodiment. The BPSG insulative layer 18 has been etched using a known photolithography technique, for example, reactive ion etching (RIE), while masking with a patterned photoresist layer (not shown) to provide a via or other contact opening 24 defined by insulative sidewalls 26 and a bottom portion 28. The contact opening extends to the diffusion region 22a (i.e., source/drain region) in the underlying silicon substrate 12 to which electrical contact is to be made.

Figure 1B:
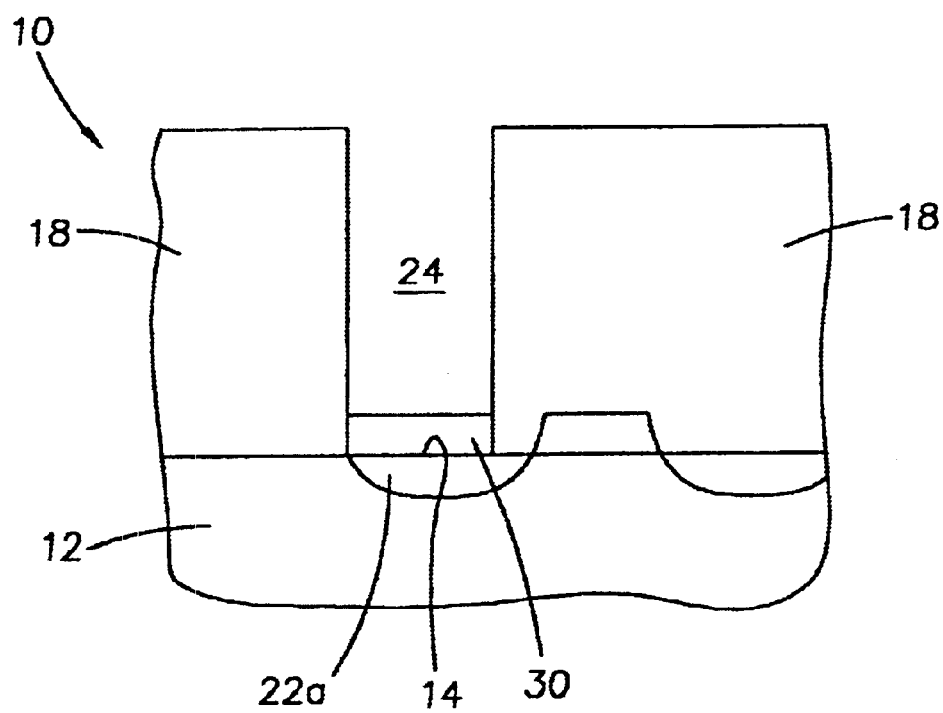
FIGS. 1B through 1D are views of the wafer fragment of FIG. 1A at subsequent and sequential processing steps, showing fabrication of a conductive contact according to an embodiment of the method of the invention.
Figure 1C:
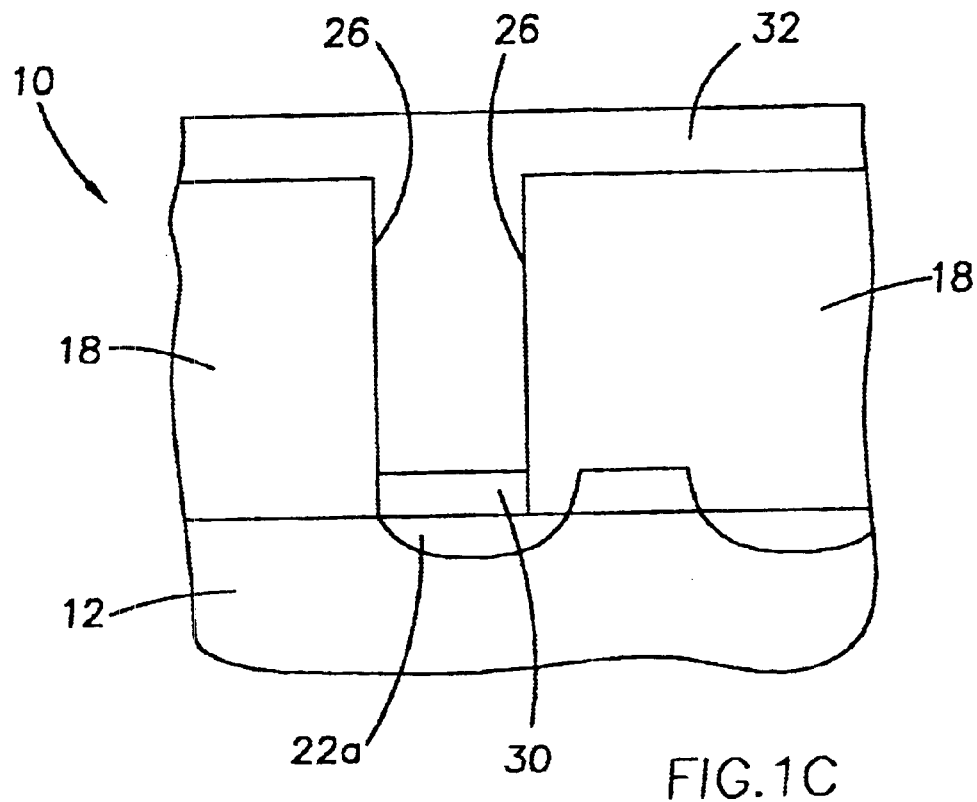

Referring to FIG. 1B, a titanium silicide ($TiSi_x$) seed layer 30 is formed over the exposed surface 14 of the silicon substrate at the bottom 28 of the contact opening 24. Typically, the seed layer is formed to a thickness of about 250 to about 300 angstroms. The resulting $TiSi_x$ seed layer 30 that forms at the interface with the diffusion region 22a is useful to lower resistance in the contact region. Techniques and process systems for forming a titanium silicide layer are well known in the art, as described, for example, in U.S. Pat. No. 6,086,442 (Sandhu, et al.) and U.S. Pat. No. 5,976,976 (Doah, et al.), the disclosures of which are incorporated by reference herein.

Preferably, the $TiSi_x$ seed layer 30 is formed by a conventional plasma-enhanced chemical vapor deposition (PECVD) process that comprises forming an RF plasma from source gases comprising titanium tetrachloride ($TiCl_4$), hydrogen ($H_2$), and carrier gases such as argon (Ar) and/or helium (He) to deposit a layer of titanium (Ti) over the substrate (silicon) surface. When the titanium film is deposited, the titanium reacts with the silicon to form a $TiSi_x$ film layer 30. Exemplary process conditions for achieving the formation of the $TiSi_x$ seed layer 30 include a wafer temperature of about 600° C., a process pressure of about 0.5 to about 20 Torr, a power range of about 100 to about 800 watts (using a parallel plate single wafer plasma reactor), and flow rates of about 150 to about 300 sccm $TiCl_4$, about 1000 to about 8000 sccm hydrogen ($H_2$), about 1000 sccm argon (Ar), and about 50 sccm nitrogen ($N_2$).

Although the preferred process for forming the $TiSi_x$ seed layer is by PECVD technique, the $TiSi_x$ seed layer 30 can also be formed by a depositing a thin layer of titanium by physical vapor deposition (PVD), i.e., sputtering, onto the surface 14 of the substrate 12 at the bottom of the contact opening, and then performing an anneal step (about 650° C.) in an ambient gas such as nitrogen, argon, ammonia, or hydrogen. This causes the titanium to react with the silicon exposed on the surface 14 of the diffusion region 22a to form the $TiSi_x$ seed layer 30. Such a process is said to be self-aligning, as the $TiSi_x$ is only formed where the titanium metal contacts the silicon active regions.

Another example of a method to deposit the $TiSi_x$ seed layer 30 is by a conventional low pressure CVD (LPCVD) process. Exemplary process conditions include a process temperature of about 650° C. to about 900° C., and a pressure of about 10 mTorr to about 1 Torr, using titanium tetrachloride ($TiCl_4$) plus a silicon precursor or source gas such as silane ($SiH_4$) or dichlorosilane ($SiH_2Cl_2$) at a ratio of about 5:1, in a carrier gas such as helium.

Figure 1D:
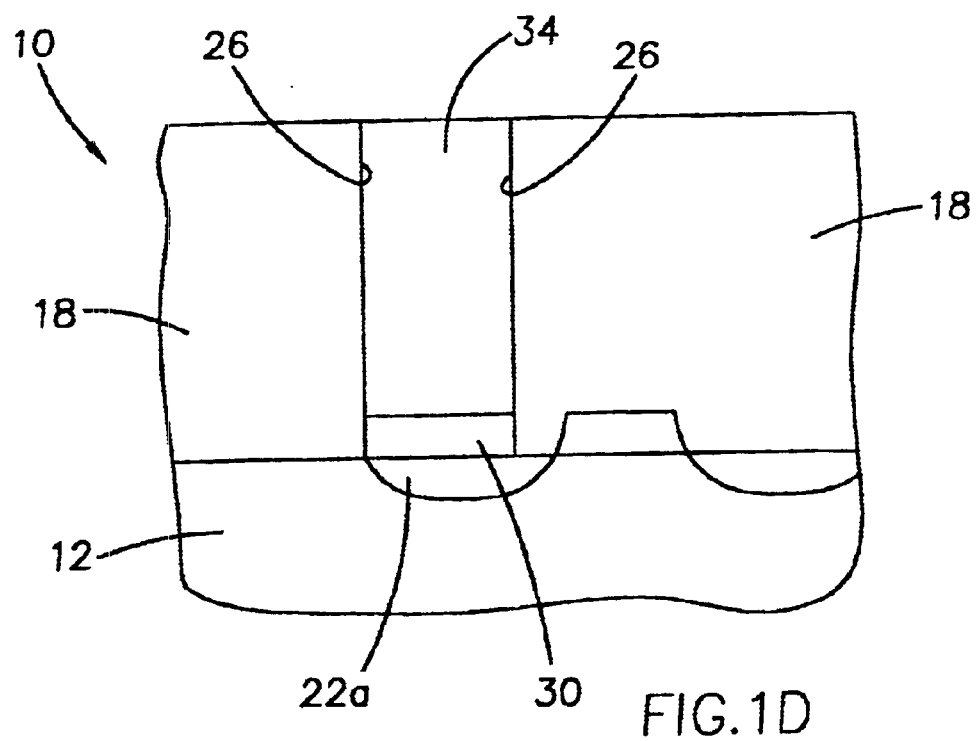

To overcome the problems that occur in the use of a pure $TiCl_4$-based titanium nitride plug or contact, such as peeling of the contact from the insulative sidewalls of the contact opening and cracking of the insulative layer, the invention utilizes a boron-doped, $TiCl_4$-based titanium nitride fill (titanium boronitride) to form the conductive contact or plug 34, as shown in FIG. 1D. Preferably, the foregoing conductive contact is formed by a conventional thermal chemical vapor deposition (TCVD) process. Such TCVD techniques and process systems are well known in the art, as described, for example, in U.S. Pat. No. 6,037,252 (Hillman et al.), and U.S. Pat. No. 5,908,947 (Iyer and Sharan), the disclosures of which are incorporated by reference herein. TCVD systems include standard thermal reactors such as cold wall/hot substrate reactors and hot wall reactors, plasma-assisted reactors, radiation beam assisted reactors, and the like.

Typically, in a TCVD process, the substrate is placed in a reaction chamber (not shown) in which the substrate and/or the gaseous precursor is heated. Preferably, the substrate is heated to a temperature in excess of the decomposition temperature of the precursor gases. When the gases are introduced into the reaction chamber and brought into contact with the substrate, the gases decompose on the surface of the substrate to deposit the titanium boronitride film comprising the metal and elements of the precursor or reactant gases.

In an exemplary TCVD process to deposit a boron-doped TiN layer according to the invention using hot or cold wall thermal chemical vapor deposition, the wafer fragment 10 is positioned in the TCVD reactor (not shown) and a gaseous material comprising titanium tetrachloride ($TiCl_4$), diborane ($B_2H_6$), ammonia ($NH_3$), and inert carrier gases such as argon, helium and/or nitrogen, is flowed into the reactor under conditions effective to chemical vapor deposit a layer 32 of boron-doped, $TiCl_4$-based titanium boronitride over the titanium silicide ($TiSi_x$) seed layer 30 within the contact opening 24. The gaseous material is deposited to a thickness to completely fill the contact opening, resulting in the structure shown in FIG. 1C. Preferred flow rates of the gases are about 100 to about 500 sccm $TiCl_4$, about 100 to about 1000 sccm $B_2H_6$, and about 100 to about 1000 sccm $NH_3$. The preferred temperature within the reactor (hot wall) or of the susceptor (cold wall) is from about temperature of about 550 to about 700° C., preferably about 560 to about 650° C., with pressure conditions within the reactor being from about 1 Torr to about 15 Torr, preferably about 10 Torr. Typically, to fill a contact opening, about 1000 to about 3000 angstroms of material is typically deposited.

The deposited conductive layer 32 comprises TiCl$_4$-based, boron doped titanium nitride having the general formula TiB$_x$N$_y$ (titanium boronitride). The amounts of the B$_2$H$_6$ and the NH$_3$ gases that are flowed into the system are maintained so as to provide a fill having a level of adherence to the insulative sidewalls 26 of the contact opening 24 such that the formed contact 34 remains attached to and does not peel away from the sidewalls, and no substantial cracks develop in the body of the insulative layer 18.

TiCl$_4$-based TiN contacts that are made without the inclusion of B$_2$H$_6$ in the gas mixture possess a reduced level of adherence to the insulative sidewalls of a contact opening. This results in the contact peeling away from the sidewalls of the opening. In addition, when such contacts reach a thickness of about 200 angstroms or more, the high thermal stress of the fill material can cause cracking of the insulative layer. With the addition of increasing amounts of B$_2$H$_6$ to the TiCl$_4$ and NH$_3$ gaseous components, there is an increase in the adhesion of the fill material of the contact 34 with the insulative sidewalls 26 of the opening 24, and a reduction in the thermal stress level, which substantially eliminates cracking of the insulative layer 18. However, as the amount of boron increases, there is also a reduction in the level of conductivity (and increase in resistance) of the contact 34. To counteract this effect, the ammonia in the gas mixture is provided in an amount effective to maintain the conductivity of the formed contact 34 at a predetermined level for an effective electrical contact with the diffusion area 22a or other semiconductor structure.

Referring to FIG. 1D, excess of the conductive layer 32 can then be removed according to known methods in the art, for example, by chemical mechanical polishing (CMP), to form the conductive contact or plug 34 for providing electrical connection to/from the diffusion region (conductive area) 22a to various parts of the semiconductor device.

The resulting contact 34 comprises a boron-doped titanium nitride layer overlying a thin titanium silicide layer deposited onto the substrate at the bottom of the contact opening. The contact 34 possesses a high level of adhesion to the insulative sidewalls of the opening, has a sufficiently low thermal stress level, measured in force per unit area (i.e., Gdynes/cm$^2$), to substantially eliminate cracking of the insulative layer, and is highly conductive with low electrical resistivity.

Although not shown, a passivation layer can then be formed over the device. Optionally, other interconnects and contact structures (not shown) can be formed overlying the present structure.

In another embodiment of the method of the invention, a multi-layered titanium nitride conductive contact can be fabricated in a wafer fragment, as depicted in FIGS. 2A through 2F.

Figure 2A:
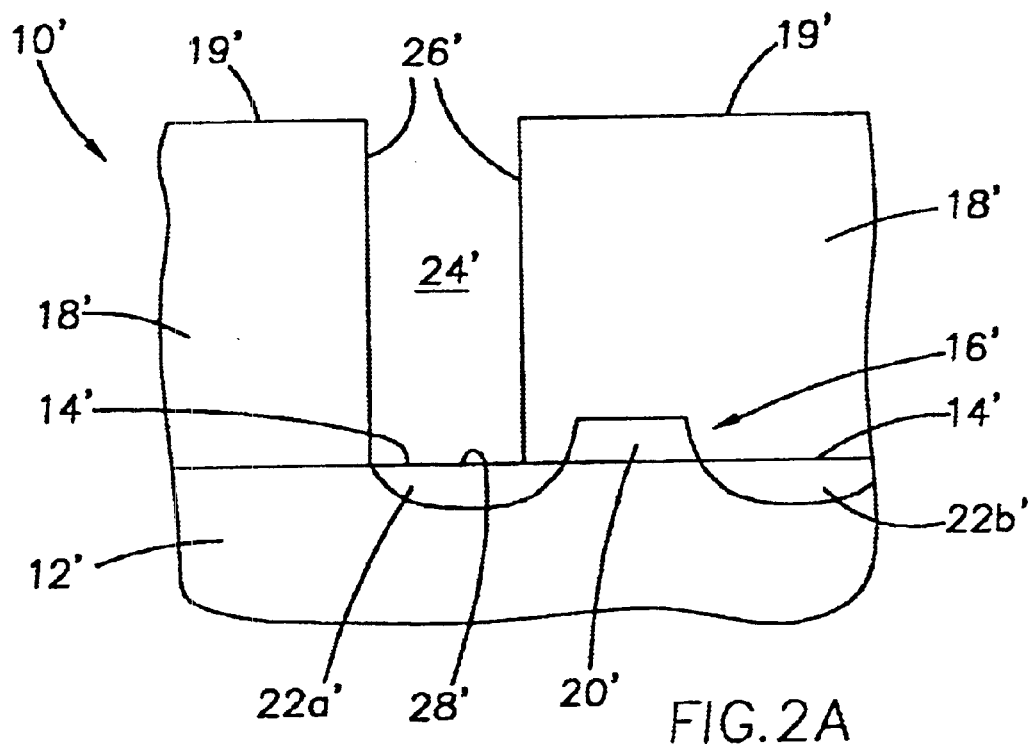
FIGS. 2A through 2F are views of the wafer fragment of FIG. 1A at subsequent and sequential processing steps, showing fabrication of a conductive contact according to another embodiment of the method of the invention.

Referring to FIG. 2A, a wafer fragment 10' is shown before processing. Briefly, wafer fragment 10' includes a silicon-comprising substrate 12', for example, monocrystalline silicon, with a conductive area 22a' such as a source/drain region. An overlying insulative layer 18' comprising, for example, BPSG, has an exposed surface 19' and a contact opening 24' having sidewalls 26' and a bottom portion 28'. The contact opening 24' extends to the conductive area 22a'.

Figure 2B:
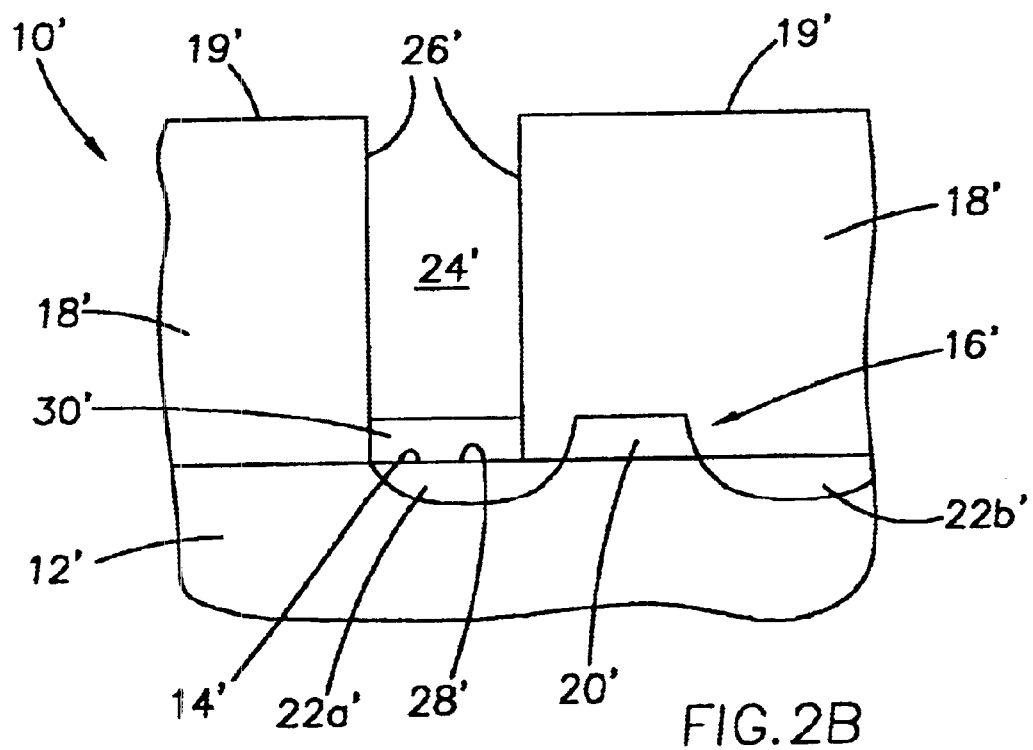

Referring to FIG. 2B, a thin titanium silicide (TiSi$_x$) layer 30' is formed over the conductive area 22a' at the bottom 28' of the opening 24'. The TiSi$_x$ layer 30' preferably has a thickness of about 250 to about 300 angstroms. The TiSi$_x$ layer 30' can be formed by conventional methods, as previously described, and preferably by PECVD using TiCl$_4$, H$_2$, and one or more carrier gases.

A layered conductive contact is formed by depositing alternating layers of TiCl$_4$-based titanium nitride and a boron-doped TiCl$_4$-based titanium nitride into the contact opening, such that a boron-doped titanium nitride layer is interposed between two layers of non-doped titanium nitride. The multi-layered contact can be formed by conventional thermal CVD processing at a temperature of about 550 to about 700° C., preferably about 560 to about 650° C., and a pressure of about 1 Torr to about 15 Torr, preferably about 10 Torr.

Figure 2C:
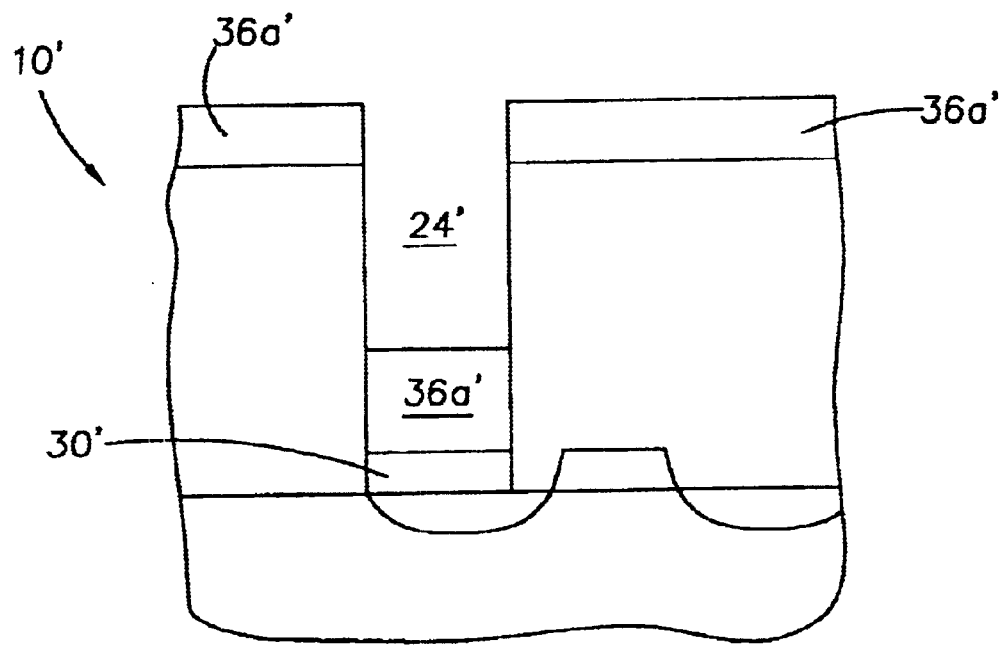

A gas mixture comprising titanium tetrachloride (TiCl$_4$) and ammonia (NH$_3$) and one or more carrier gases can be flowed into the reactor to form a layer 36a' of non-doped titanium nitride onto the TiSi$_x$ seed layer 30' to a desired thickness, typically about 100 to about 500 angstroms, resulting in the structure shown in FIG. 2C. Preferred flow rates for the gas mixture are about 100 to about 500 sccm TiCl$_4$ and about 100 to about 1000 sccm NH$_3$.

Figure 2D:
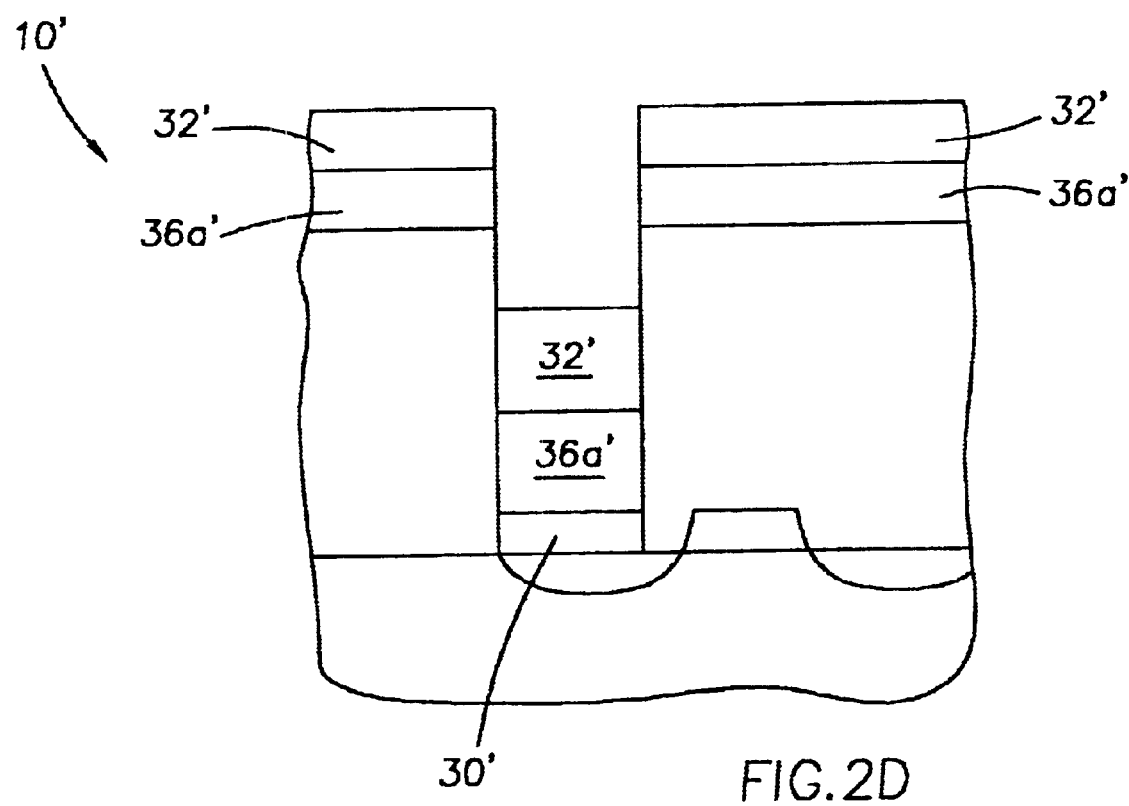

As shown in FIG. 2D, diborane (B$_2$H$_6$) is then flowed into the reactor, and a layer 32' comprising boron-doped, titanium nitride is deposited onto the non-doped titanium nitride layer from a gas mixture comprising TiCl$_4$, NH$_3$, and B$_2$H$_6$. The boron-doped, titanium nitride layer 32' is deposited to a desired thickness of about 100 to about 500 angstroms. Preferred flow rates for the gas mixture are about 100 to about 500 sccm TiCl$_4$, about 100 to about 1000 sccm NH$_3$, and about 100 to about 1000 sccm B$_2$H$_6$. As previously discussed, the flow of NH$_3$ and B$_2$H$_6$ can be controlled to modify the adhesiveness, thermal stress level, and conductivity of the resulting multi-layered contact.

Figure 2E:
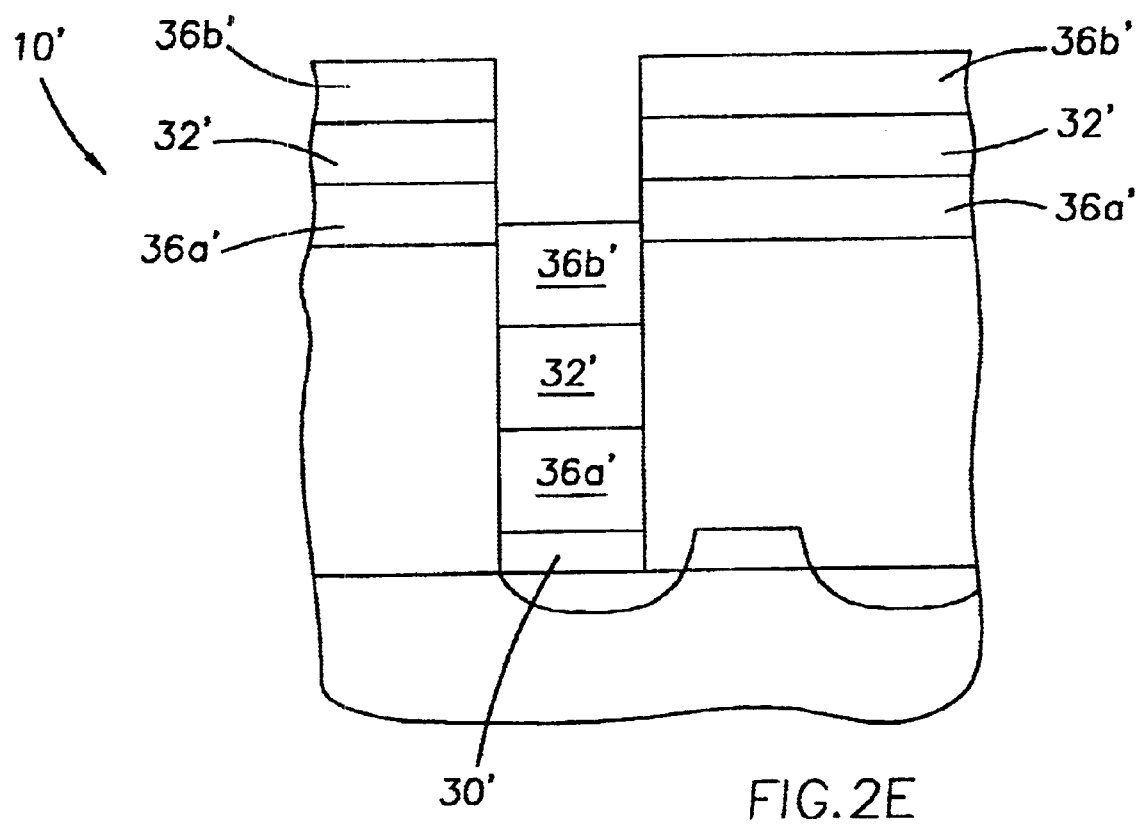

The flow of B$_2$H$_6$ is then ceased, and the first gas mixture (i.e., TiCl$_4$, NH$_3$) is flowed into the reactor to form a layer 36b' comprising undoped titanium nitride, as shown in FIG. 2E. The titanium nitride layer 36b' is deposited to a desired thickness, typically about 100 to about 500 angstroms. The titanium nitride layer 36b' can be deposited to fill the opening. Alternatively, additional layers of boron-doped titanium nitride can be deposited between two layers of non-doped titanium nitride as desired to fill the contact opening 24', with the uppermost layer of the contact comprising non-doped titanium nitride.

Figure 2F:
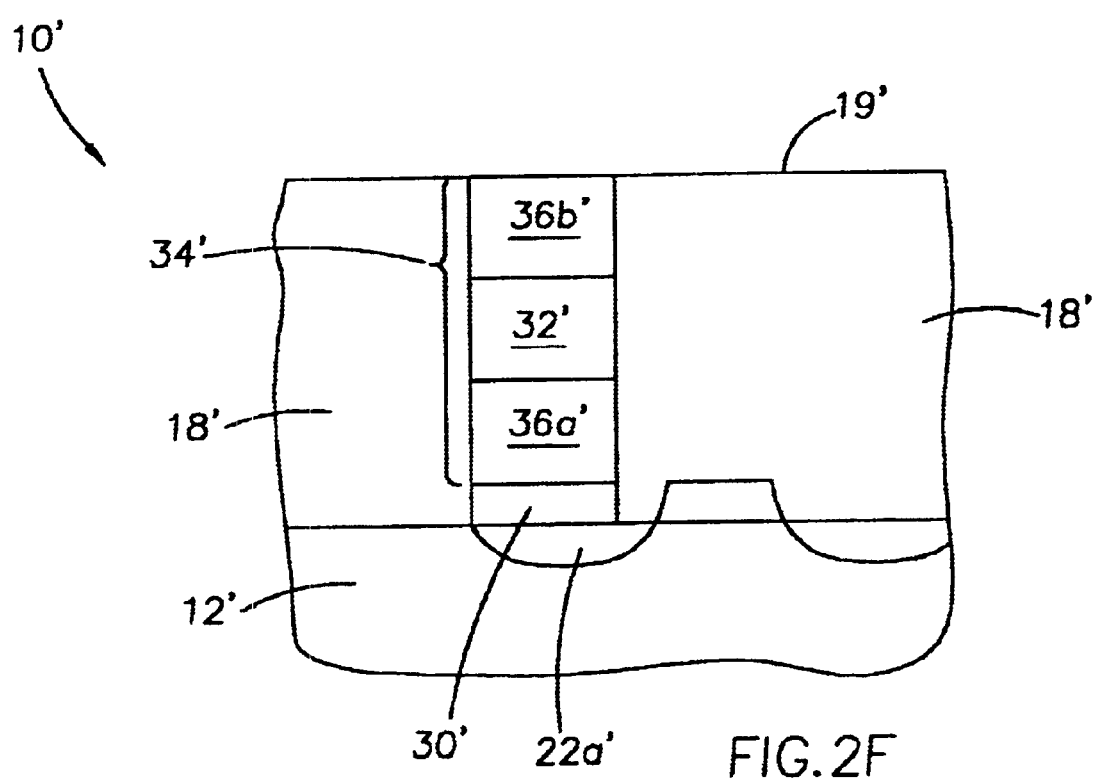

Excess material can be removed as depicted in FIG. 2F, for example, by CMP, to form the conductive contact 34'.

Sandwiching a layer of boron-doped titanium nitride 32' between undoped titanium nitride substantially reduces the thermal stress in a TiCl$_4$-based TiN fill material. This allows the fill to be used as a conductive contact to replace tungsten (W) plugs in high aspect ratio features. The combination of alternating layers achieves a TiCl$_4$-based TiN contact having a level of adhesion that substantially eliminates peeling of the formed contact from the sidewalls of the contact opening. It also provides a lowered level of thermal stress that substantially reduces cracking of the body of the insulative layer, particularly when the thickness of the contact reaches about 500 angstroms or greater. In addition, the resulting contact has a high level of conductivity for an effective electrical contact to a diffusion region or other conductive structure.

EXAMPLE

A boron-doped TiCl$_4$-based titanium nitride (TiN) contact was formed in a high aspect ratio opening of a BPSG layer according to the method of the invention. The flow of diborane ($B_2H_6$) was varied over a range to test the change in thermal stress (Gdynes/cm$^2$) of the boron-doped, $TiCl_4$-based TiN contact on the BPSG insulative layer.

A wafer fragment was provided that had a silicon substrate layer and an overlying layer of BPSG. A contact opening was formed through the BPSG layer. The aspect ratio of the opening was 10:1.

The $TiCl_4$-based TiN film was deposited by thermal CVD at a pressure of 10 Torr using a Centura system, available from Applied Materials company of Santa Clara, Calif. The precursor gases were flowed into the reactor as follows: 340 sccm $TiCl_4$, 200 sccm $NH_3$, 3000 sccm argon (Ar), and 2000 sccm gaseous nitrogen ($N_2$). The diborane ($B_2H_6$) was flowed into the reactor at a rate ranging from 200 sccm to 600 sccm. Data was measured at two different temperatures: 600° C. and 650° C.

Figure 3A:
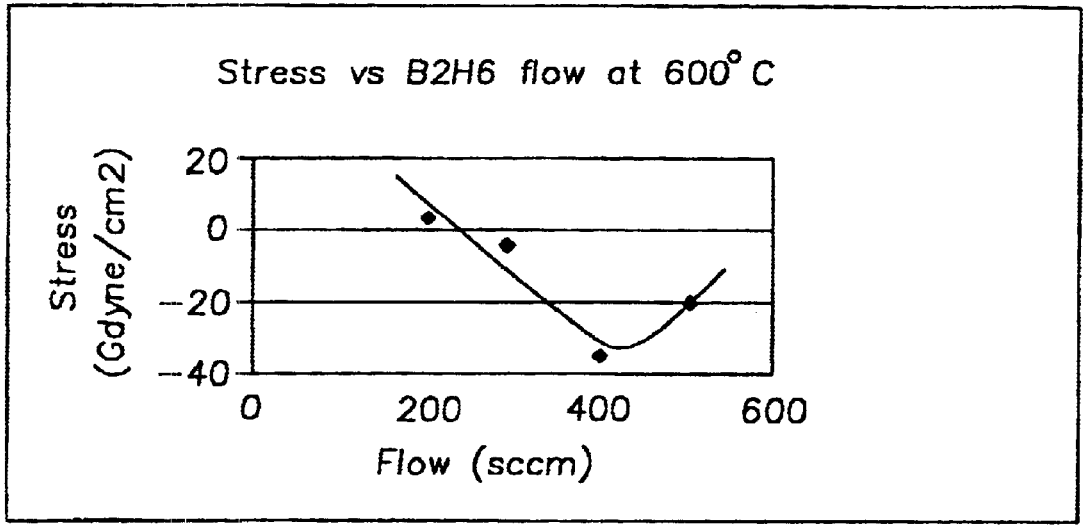
FIGS. 3A and 3B are graphical depictions showing the amount of thermal stress (Gdynes/cm$^2$) versus diborane ($B_2H_6$) flow over a range of 200 to 600 sccm at reactor temperatures of 600° C. and 650° C.
Figure 3B:
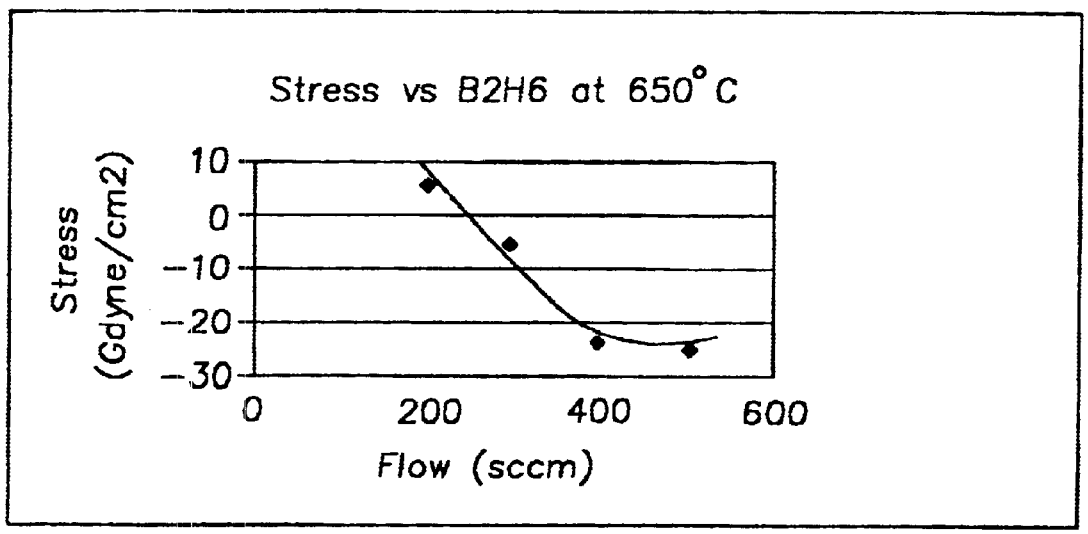

The results are shown in a graphical form in FIGS. 3A and 3B. As indicated, as the amount of boron (i.e., $B_2H_6$) was increased, the stress (Gdynes/cm$^2$) of the $TiCl_4$-based TiN material decreased to a neutral or zero stress level and below. Thus, by varying the $B_2H_6$ flow, the thermal stress of the $TiCl_4$-based TiN film can be adjusted such that the material does not cause the insulative layer (e.g., BPSG) to crack.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a conductive contact in a semiconductor device comprising an opening through an insulative layer, the opening having sidewalls and extending to an underlying silicon-comprising substrate, the method comprising the steps of:
    depositing a layer comprising titanium silicide over the substrate within the opening; and
    depositing titanium boronitride over the titanium silicide layer to form the conductive contact.

2. The method of claim 1, wherein the opening has an aspect ratio of about 3:1 or greater.

3. The method of claim 1, wherein the opening is about 0.25 μm or less.

4. The method of claim 1, wherein the conductive contact is selected from the group consisting of a local interconnect, contact, buried contact, via, plug, and filled trench.

5. The method of claim 1, wherein the conductive contact has a thickness of about 200 angstroms or greater.

6. The method of claim 1, wherein the conductive contact has a thickness of about 1000 to about 3000 angstroms.

7. The method of claim 1, wherein the step of depositing the titanium boronitride layer is by thermal chemical vapor deposition using a gaseous mixture comprising titanium tetrachloride, ammonia and diborane.

8. The method of claim 7, wherein the step of depositing the titanium boronitride layer is performed by flowing about 100 to about 500 sccm titanium tetrachloride, about 100 to about 1000 sccm ammonia, and about 100 to about 1000 sccm diborane over the substrate.

9. The method of claim 7, wherein the gaseous mixture comprises the diborane in an amount effective to provide the conductive contact with a level of boron such that the contact adheres to the sidewalls of the opening, with no substantial cracks being formed in the insulative layer.

10. The method of claim 7, wherein the amount of diborane is effective to provide the conductive contact with a level of thermal stress to substantially eliminate cracking of the insulative layer.

11. The method of claim 7, wherein the gaseous mixture comprises the ammonia in an amount effective to provide the conductive contact with an effective amount of conductivity to an active area within the substrate.

12. The method of claim 11, wherein the active area comprises a source or drain region.

13. The method of claim 1, wherein the step of depositing the titanium boronitride layer comprises:
    depositing a layer of titanium nitride over the titanium silicide layer;
    depositing a layer of titanium boronitride over the titanium nitride layer; and
    depositing a layer of titanium nitride over the titanium boronitride layer to fill the opening; and
    repeating the foregoing steps to form a multi-layered film.

14. The method of claim 1, wherein the step of depositing the titanium boronitride layer comprises depositing a layer of titanium nitride over the titanium silicide layer, and sequentially depositing overlying layers of titanium boronitride and titanium nitride to form a multi-layered film,
    the film comprising a titanium boronitride layer interposed between two titanium nitride layers.

15. The method of claim 14, wherein the titanium boronitride layer is deposited by thermal chemical vapor deposition by flowing about 100 to about 500 sccm titanium tetrachloride, about 100 to about 1000 sccm ammonia, and about 100 to about 1000 sccm diborane over the substrate.

16. The method of claim 14, wherein the titanium nitride layer is deposited by thermal chemical vapor deposition by flowing about 100 to about 500 sccm titanium tetrachloride and about 100 to about 1000 sccm ammonia.

17. The method of claim 14, wherein each of the layers of the multi-layered film are about 100 to about 500 angstroms thick.

18. The method of claim 1, wherein the insulative layer comprises an oxide selected from the group consisting of silicon dioxide, phosphosilicate glass, borosilicate glass, and borophosphosilicate glass.

19. The method of claim 1, wherein the insulative layer comprises borophosphosilicate glass.

20. The method of claim 1, wherein the step of depositing the titanium silicide layer is by plasma enhanced chemical vapor deposition using a gas comprising titanium tetrachloride.

21. The method of claim 1, wherein the step of depositing the titanium silicide layer comprises the steps of sputtering titanium onto the substrate, and annealing the titanium.

22. The method of claim 1, wherein the step of depositing the titanium silicide layer is by a chemical vapor deposition using titanium tetrachloride and a silicon source gas.

23. The method of claim 22, wherein the silicon source gas is selected from the group consisting of silane, dichlorosilane, and mixtures thereof.

24. The method of claim 1, wherein the titanium silicide layer is formed to a thickness of about 250 to about 300 angstroms.

25. The method of claim 1, further comprising, after the step of forming the titanium, boronitride layer, the step of removing an excess portion of the titanium nitride layer to form the conductive contact in the opening.

26. The method of claim 25, wherein the step of removing the titanium boronitride layer is performed by chemical-mechanical polishing.

27. A method of forming a conductive component in a semiconductor device, comprising the steps of:
providing a silicon-comprising substrate with an overlying insulative layer having at least one opening formed therethrough to expose the substrate;
forming a layer comprising titanium silicide over the substrate within the opening; and
forming a layer comprising titanium boronitride over the titanium silicide layer to fill the opening.

28. The method of claim 27, wherein the titanium boronitride layer comprises an amount of boron to substantially eliminate peeling of the contact from the sidewall of the opening and cracking of the insulative layer, and an amount of nitrogen to provide an effective amount of conductivity to an active area within the substrate.

29. The method of claim 27, wherein the step of forming the titanium boronitride layer comprises depositing a layer of titanium nitride over the titanium silicide layer, and sequentially depositing overlying layers of titanium boronitride and titanium nitride to form a multi-layered film wherein the titanium boronitride layer is disposed between titanium nitride layers.

30. A method of forming a conductive contact in an opening within a semiconductor device, the opening formed in an insulative layer and extending to an underlying silicon-comprising substrate, the method comprising the steps of:
forming a layer comprising titanium silicide over the substrate within the opening; and
depositing a titanium boronitride material over the titanium silicide layer and within the opening from a gaseous mixture comprising titanium tetrachloride, ammonia, and diborane by thermal chemical vapor deposition.

31. The method of claim 30, wherein the titanium boronitride layer comprises an amount of boron to substantially eliminate peeling of the contact from the sidewall of the opening and cracking of the insulative layer, and an amount of nitrogen to provide an effective amount of conductivity to an active area within the substrate.

32. A method of forming a conductive contact in an opening within a semiconductor device, the opening formed in an insulative layer and extending to an underlying silicon-comprising substrate, the opening defined by sidewalls and a bottom portion; the method comprising the steps of:
forming a layer comprising titanium silicide over the substrate within the opening; and
depositing a titanium boronitride material over the titanium silicide layer and into the opening to form the conductive contact;
wherein the conductive contact comprises an amount of boron to substantially eliminate peeling of the contact from the sidewall of the opening and cracking of the insulative layer, and an amount of nitrogen to provide an effective amount of conductivity to an active area within the substrate.

33. A method of forming a conductive contact in an opening within a semiconductor device, the opening formed in an insulative layer and extending to an underlying silicon-comprising substrate, the opening having sidewalls, the method comprising the steps of:
forming a layer comprising titanium silicide over the substrate within the opening by plasma enhanced chemical vapor deposition using titanium tetrachloride; and
depositing a titanium boronitride material over the titanium silicide layer and into the opening by thermal chemical vapor deposition using a gaseous mixture comprising titanium tetrachloride, ammonia, and diborane.

34. The method of claim 33, wherein the titanium boronitride material is deposited by flowing about 100 to about 500 sccm titanium tetrachloride, about 100 to about 1000 sccm ammonia, and about 100 to about 1000 sccm diborane over the device.

35. The method of claim 33, wherein the flow of diborane and ammonia is effective to deposit an amount of boron and nitrogen such that the conductive contact has effective levels of conductivity and resistivity, and a level of adhesion to the sidewalls of the opening through the insulative layer to substantially eliminate peeling of the contact from the opening sidewalls.

36. The method of claim 34, wherein the flow of diborane is effective to deposit an amount of boron such that the conductive contact has a level of thermal stress to substantially eliminate cracking of the insulative layer.

37. A method of forming a conductive contact in an opening within a semiconductor device, the opening formed in an insulative layer and extending to an underlying Silicon-comprising substrate, the opening having sidewalls, the method comprising the steps of:
forming a layer comprising titanium silicide over the substrate within the opening; and
depositing a titanium boronitride material over the titanium silicide layer and into the opening by thermal chemical vapor deposition using a gaseous mixture comprising titanium tetrachloride, ammonia, and diborane;
wherein the flow of diborane and ammonia is effective to deposit an amount of boron and nitrogen such that the conductive contact has effective levels of conductivity and resistivity, and a level of adhesion to the sidewalls of the opening through the insulative layer to substantially eliminate peeling of the contact from the opening sidewalls.

38. A method of forming a conductive contact in an opening within a semiconductor device, the opening formed in an insulative layer and extending to an underlying silicon-comprising substrate, the opening having sidewalls, the method comprising the steps of:
forming a layer comprising titanium silicide over the substrate within the opening; and
depositing a titanium boronitride material over the titanium silicide layer and into the opening by thermal chemical vapor deposition using a gaseous mixture comprising titanium tetrachloride, ammonia, and diborane;
wherein the flow of diborane is effective to deposit an amount of boron such that the conductive contact has a level of thermal stress to substantially eliminate cracking of the insulative layer.

39. A method of forming a conductive contact in an opening within a semiconductor device, the opening formed in an insulative layer and extending to an underlying silicon-comprising substrate, the method comprising the steps of:
forming a layer comprising titanium silicide over the substrate within the opening; and
depositing a titanium boronitride material over the titanium silicide layer by chemical vapor deposition by flowing about 100 to about 500 sccm titanium tetrachloride, about 100 to about 1000 sccm ammonia, and about 100 to about 1000 sccm diborane;

wherein the flow of diborane and ammonia is effective to deposit an amount of boron and nitrogen such that the conductive contact has effective levels of conductivity and resistivity, and a level of adhesion to the sidewalls of the opening through the insulative layer to substantially eliminate peeling of the contact from the opening sidewalls.

40. The method of claim 39, wherein the flow of diborane is effective to deposit an amount of boron such that the conductive contact has a level of thermal stress to substantially eliminate cracking of the insulative layer.

41. A method of forming a conductive contact within a high aspect ratio opening, comprising the steps of:
providing a substrate having a silicon-comprising substrate and an insulative layer formed thereon, the insulative layer having at least one contact opening formed therethrough to expose the substrate; the contact opening having an aspect ratio of at least about 3:1;
forming a layer comprising titanium silicide over the exposed substrate within the contact opening; and
forming a layer comprising titanium boronitride over the titanium silicide layer to fill the contact opening.

42. The method of claim 41, wherein the contact opening has a width of about 0.25 $\mu$m or less.

43. A method of forming a conductive component in a semiconductor device, comprising the steps of:
providing a silicon-comprising substrate with an overlying insulative layer having at least one opening formed therethrough to expose the substrate, and a titanium silicide layer overlying the substrate within the opening, the opening having sidewalls; and
filling the opening with a titanium boronitride material;
wherein the conductive component comprises amounts of boron and nitrogen such that the conductive component has effective levels of conductivity and resistivity, and a level of adhesion to the sidewalls of the opening through the insulative layer to substantially eliminate peeling of the contact from the opening sidewalls.

44. The method of claim 43, wherein the conductive component comprises an amount of boron to provide a level of thermal stress to substantially eliminate cracking of the insulative layer.

45. A method of forming a conductive component in a semiconductor device, the device comprising a silicon-comprising substrate with an overlying insulative layer having at least one opening formed therethrough to expose the substrate, comprising the steps of:
forming a titanium silicide layer over the substrate within the opening; and
filling the opening with a titanium boronitride material;
wherein the conductive component comprises amounts of boron and nitrogen such that the conductive component has effective levels of conductivity and resistivity, and a level of adhesion to the sidewalls of the opening through the insulative layer to substantially eliminate peeling of the contact from the opening sidewalls.

46. The method of claim 45, wherein the conductive component comprises an amount of boron to provide a level of thermal stress to substantially eliminate cracking of the insulative layer.

47. A method of forming a conductive contact within a high aspect ratio opening through an insulative layer to an underlying silicon-comprising substrate, the opening having sidewalls, the method comprising the steps of:
flowing a gaseous mixture comprising titanium tetrachloride to deposit a layer of titanium silicide on the substrate; and
flowing a gaseous mixture comprising titanium tetrachloride, ammonia and diborane to deposit a layer comprising titanium boronitride over the titanium silicide layer.

48. The method of claim 47, wherein the titanium boronitride layer is deposited by chemical vapor deposition by flowing about 100 to about 500 sccm titanium tetrachloride, about 100 to about 1000 sccm ammonia over the substrate, and about 100 to about 1000 sccm diborane over the substrate.

49. The method of claim 47, wherein the gaseous mixture to form the titanium boronitride layer comprises the diborane in an amount effective to adhere the conductive contact to the sidewalls of the opening, with no substantial cracks being formed in the insulative layer.

50. The method of claim 47, wherein the gaseous mixture to form the titanium boronitride layer comprises the diborane in an amount effective to provide the conductive contact with a level of thermal stress to substantially eliminate cracking of the insulative layer.

51. The method of claim 47, wherein the gaseous mixture to form the titanium boronitride layer comprises the ammonia in an amount effective to provide an effective amount of conductivity to an active area within the substrate.

52. The method of claim 47, further comprising, prior to and after the step of flowing the gaseous mixture to deposit the titanium boronitride layer, the step of flowing a gaseous mixture comprising titanium tetrachloride and ammonia to deposit a layer comprising titanium nitride.

53. A method of forming a semiconductor device, comprising the steps of:
forming an insulative layer over a silicon-comprising substrate comprising a conductive area;
forming an opening in the insulative layer to expose the conductive area of the substrate, the opening having sidewalls;
forming a seed layer comprising titanium silicide over the substrate within the opening; and
forming a layer comprising titanium boronitride over the seed layer to fill the opening;
whereby the titanium boronitride comprises an amount of boron effective to provide the conductive contact with a level of adhesion to the insulative layer within the opening to substantially eliminate peeling of the conductive contact from the sidewalls of the opening, and a level of thermal stress to substantially eliminate cracking of the insulative layer; and an amount of nitrogen effective to maintain the conductivity of the contact at a predetermined level for an effective electrical contact with the conductive area.

54. A method of forming a conductive contact in a semiconductor device comprising an opening through an insulative layer, the opening having sidewalls and extending to an underlying silicon-comprising substrate, the method comprising the steps of:
depositing a layer comprising titanium silicide over the substrate within the opening; and
forming a multi-layered fill over the titanium silicide layer by the steps of:
depositing a layer of titanium nitride over the titanium silicide layer;
depositing a layer of titanium boronitride over the titanium nitride layer; and
depositing a layer of titanium nitride over the titanium boronitride layer.

55. The method of claim 54, further comprising repeating the steps of depositing the layers of titanium nitride and titanium boronitride to fill the opening such that the titanium boronitride layer is interposed between titanium nitride layers.

56. A method of forming a conductive contact in a semiconductor device comprising an opening through an insulative layer, the opening having sidewalls and extending to an underlying silicon-comprising substrate, the method comprising the steps of:
depositing a layer comprising titanium silicide over the substrate within the opening; and
forming a fill over the titanium silicide by depositing a layer of titanium nitride over the titanium silicide layer; and sequentially depositing overlying layers of titanium boronitride and titanium nitride to fill the opening, wherein the titanium boronitride layer is interposed between titanium nitride layers.

57. The method of claim 56, wherein the opening has an aspect ratio of about 3:1 or greater.

58. The method of claim 56, wherein the opening is about 0.25 µm or less.

59. The method of claim 56, wherein the conductive contact is selected from the group consisting of a local interconnect, contact, buried contact, via, plug, and filled trench.

60. The method of claim 56, wherein the conductive contact has a thickness of about 200 angstroms or greater.

61. The method of claim 56, wherein the conductive contact has a thickness of about 1000 to about 3000 angstroms.

62. The method of claim 56, wherein each of the layers of the conductive contact are about 100 to about 500 angstroms thick.

63. The method of claim 56, wherein the step of forming the fill comprises depositing the titanium nitride layer by thermal chemical vapor deposition using a gaseous mixture comprising titanium tetrachloride and ammonia.

64. The method of claim 63, wherein the titanium nitride layer is deposited by thermal chemical vapor deposition by flowing about 100 to about 500 sccm titanium tetrachloride and about 100 to about 1000 sccm ammonia over the substrate.

65. The method of claim 56, wherein the step of forming the fill comprises depositing the titanium boronitride layer by thermal chemical vapor deposition using a gaseous mixture comprising titanium tetrachloride, ammonia and diborane.

66. The method of claim 65, wherein the titanium boronitride layer is deposited by thermal chemical vapor deposition by flowing about 100 to about 500 sccm titanium tetrachloride, about 100 to about 1000 sccm ammonia, and about 100 to about 1000 sccm diborane over the substrate.

67. The method of claim 65, wherein the gaseous mixture comprises the diborane in an amount effective to provide the conductive contact with a level of adherence to the sidewalls of the opening, with no substantial cracks being formed in the insulative layer.

68. The method of claim 65, wherein the gaseous mixture comprises an amount of diborane effective to provide the conductive contact with a level of thermal stress to substantially eliminate cracking of the insulative layer.

69. The method of claim 65, wherein the gaseous mixture comprises the ammonia in an amount effective to provide an effective amount of conductivity to an active area within the substrate.

70. The method of claim 69, wherein the active area comprises a source or drain region.

71. The method of claim 56, wherein the insulative layer comprises an oxide selected from the group consisting of silicon dioxide, phosphosilicate glass, borosilicate glass, and borophosphosilicate glass.

72. The method of claim 56, wherein the insulative layer comprises borophosphosilicate glass.

73. The method of claim 56, wherein the step of depositing the titanium silicide layer is by plasma enhanced chemical vapor deposition using a gas comprising titanium tetrachloride.

74. The method of claim 56, wherein the step of depositing the titanium silicide layer comprises the steps of sputtering titanium onto the substrate, and annealing the titanium.

75. The method of claim 56, wherein the step of depositing the titanium silicide layer is by a chemical vapor deposition using titanium tetrachloride and a silicon source gas.

76. The method of claim 75, wherein the silicon source gas is selected from the group consisting of silane, dichlorosilane, and mixtures thereof.

77. The method of claim 56, wherein the titanium silicide layer is formed to a thickness of about 250 to about 300 angstroms.

78. The method of claim 56, further comprising, after the step of forming the fill, the step of removing an excess portion of the fill to form the conductive contact in the opening.

79. The method of claim 78, wherein the step of removing the fill is performed by chemical-mechanical polishing.

80. A method of forming a conductive component in a semiconductor device, comprising the steps of:
providing a silicon-comprising substrate with an overlying insulative layer having at least one opening formed therethrough to expose the substrate, the opening having sidewalls;
forming a layer comprising titanium silicide over the substrate within the opening; and
forming a layer comprising titanium boronitride over the titanium silicide layer to fill the opening by depositing a layer of titanium nitride over the titanium silicide layer, and sequentially depositing overlying layers of titanium boronitride and titanium nitride to form a multi-layered film wherein the titanium boronitride layer is interposed between titanium nitride layers.

81. The method of claim 80, wherein the titanium boronitride layer comprises an amount of boron to substantially eliminate peeling of the contact from the sidewall of the opening and cracking of the insulative layer, and an amount of nitrogen to provide an effective amount of conductivity to an active area within the substrate.

82. A method of forming a conductive contact in an opening within a semiconductor device, the opening formed in an insulative layer and extending to an underlying silicon-comprising substrate, the opening having sidewalls, the method comprising the steps of:
forming a layer comprising titanium silicide over the substrate within the opening; and
filling the opening by
depositing a layer of titanium nitride material over the titanium silicide layer and into the opening from a gaseous mixture comprising titanium tetrachloride and ammonia by thermal chemical vapor deposition;
depositing a layer of titanium boronitride material over the titanium nitride layer from a gaseous mixture comprising titanium tetrachloride, ammonia and diborane by thermal chemical vapor deposition; and
depositing a layer of titanium nitride material over the titanium boronitride layer from a gaseous mixture comprising titanium tetrachloride and ammonia by thermal chemical vapor deposition; and repeating the steps of depositing titanium boronitride material and the titanium nitride material as needed to fill the opening, wherein the titanium boronitride layer is interposed between titanium nitride layers.

83. The method of claim 82, wherein the titanium boronitride layer comprises an amount of boron to substantially eliminate peeling of the contact from the sidewall of the opening and cracking of the insulative layer, and an amount of nitrogen to provide an effective amount of conductivity to an active area within the substrate.

84. A method of forming a conductive contact in an opening within a semiconductor device, the opening formed in an insulative layer and extending to an underlying silicon-comprising substrate, the opening having sidewalls, the method comprising the steps of:

forming a layer comprising titanium silicide over the substrate within the opening by plasma enhanced chemical vapor deposition using titanium tetrachloride; and forming a fill comprising titanium boronitride layer interposed between titanium nitride layers by depositing a titanium nitride material and a titanium boronitride material into the opening by thermal chemical vapor deposition using a gaseous mixture comprising titanium tetrachloride and ammonia, with and without diborane.

85. The method of claim 84, wherein the amount of diborane and ammonia in the gas mixture is effective to provide the conductive contact with effective levels of conductivity resistivity, and a level of adhesion to the sidewalls of the opening through the insulative layer to substantially eliminate peeling of the contact from the opening sidewalls.

86. The method of claim 84, wherein the amount of boron in the gaseous mixture is effective to provide the conductive contact with a level of thermal stress to substantially eliminate cracking of the insulative layer.

87. A method of forming a conductive contact in an opening within a semiconductor device, the opening formed in an insulative layer and extending to an underlying silicon-comprising substrate, the opening having sidewalls, the method comprising the steps of:

forming a layer comprising titanium silicide over the substrate within the opening by plasma enhanced chemical vapor deposition using titanium tetrachloride; and forming a fill comprising titanium boronitride layer interposed between titanium nitride layers by depositing a titanium nitride material and a titanium boronitride material the opening by thermal chemical vapor deposition using a gaseous mixture comprising titanium tetrachloride and ammonia, with and without diborane;

wherein the amount of diborane and ammonia in the gaseous mixture is effective to provide the conductive contact with effective levels of conductivity and resistivity, and a level of adhesion to the sidewalls of the opening through the insulative layer to substantially eliminate peeling of the contact from the opening sidewalls.

88. The method of claim 87, wherein the amount of boron in the gaseous mixture is effective to provide the conductive contact with a level of thermal stress to substantially eliminate cracking of the insulative layer.

89. A method of forming a conductive contact in an opening within a semiconductor device, the opening formed in an insulative layer and extending to an underlying silicon-comprising substrate, the opening having sidewalls, the method comprising the steps of:

forming a layer comprising titanium silicide over the substrate within the opening; and depositing a titanium nitride material and a titanium boronitride material into the opening by thermal chemical vapor deposition using a gaseous mixture comprising titanium tetrachloride and ammonia, with and without diborane;

wherein the amount of diborane and ammonia in the gaseous mixture is effective to provide the conductive contact with effective levels of conductivity and resistivity, and a level of adhesion to the sidewalls of the opening through the insulative layer to substantially eliminate peeling of the contact from the opening sidewalls.

90. A method of forming a conductive contact in an opening within a semiconductor device, the opening formed in an insulative layer and extending to an underlying silicon-comprising substrate, the method comprising the steps of:

forming a layer comprising titanium silicide over the substrate within the opening; and depositing alternating layers of titanium nitride material and titanium boronitride material into the opening by chemical vapor deposition by flowing about 100 to about 500 sccm titanium tetrachloride and about 100 to about 1000 sccm ammonia, and about 100 to about 1000 sccm diborane to form the titanium boronitride layer;

wherein the titanium boronitride layer is interposed between titanium nitride layers; and the flow of diborane and ammonia is effective to deposit an amount of boron and nitrogen such that the conductive contact has effective levels of conductivity and resistivity, and a level of adhesion to the sidewalls of the opening through the insulative layer to substantially eliminate peeling of the contact from the opening sidewalls.

91. The method of claim 90, wherein the flow of diborane is effective to deposit an amount of boron such that the conductive contact has a level of thermal stress to substantially eliminate cracking of the insulative layer.

92. A method of forming a conductive contact within a high aspect ratio opening, comprising the steps of:

providing a substrate having a silicon-comprising substrate and an insulative layer formed thereon, the insulative layer having at least one contact opening formed therethrough to expose the substrate; the contact opening having an aspect ratio of at least about 3:1;

forming a layer comprising titanium silicide over the exposed substrate within the contact opening; and forming a multi-layered fill within the opening comprising alternating layers of titanium nitride material and titanium boronitride material;

wherein the titanium boronitride layer is interposed between titanium nitride layers, and the conductive contact has effective levels of conductivity and resistivity, and a level of adhesion to the sidewalls of the opening through the insulative layer to substantially eliminate peeling of the contact from the opening sidewalls.

93. A method of forming a conductive component in a semiconductor device, comprising the steps of:

providing a silicon-comprising substrate with an overlying insulative layer having at least one opening formed therethrough to expose the substrate, and a titanium silicide layer overlying the substrate within the opening, the opening having sidewalls; and filling the opening with alternating layers of titanium nitride and titanium boronitride material;

wherein the titanium boronitride layer is interposed between titanium nitride layers, and the conductive component comprises amounts of boron and nitrogen such that the conductive component has effective levels of conductivity and resistivity, and a level of adhesion to the sidewalls of the opening through the insulative layer to substantially eliminate peeling of the contact from the opening sidewalls.

94. The method of claim 93, wherein the conductive component comprises an amount of boron to provide a level of thermal stress to substantially eliminate cracking of the insulative layer.

95. A method of forming a conductive component in a semiconductor device, the device comprising a silicon-comprising substrate with an overlying insulative layer having at least one opening formed therethrough to expose the substrate, comprising the steps of:

forming a titanium silicide layer over the substrate within the opening; and filling the opening with alternating layers of titanium nitride and titanium boronitride material;

wherein the titanium boronitride layer is interposed between titanium nitride layers, and the conductive component comprises amounts of boron and nitrogen such that the conductive component has effective levels of conductivity and resistivity, and a level of adhesion to the sidewalls of the opening through the insulative layer to substantially eliminate peeling of the contact from the opening sidewalls.

96. A method of forming a conductive contact in an opening within a semiconductor device, the opening formed in an insulative layer to an underlying silicon-comprising substrate, the opening having sidewalls; the method comprising the steps of:

forming a layer comprising titanium silicide over the substrate within the opening; and forming a fill within the opening by:

flowing a gaseous mixture comprising titanium tetrachloride and ammonia to deposit a layer comprising titanium nitride over the titanium silicide layer;

flowing a gaseous mixture comprising titanium tetrachloride, ammonia and diborane to deposit a layer comprising titanium boronitride over the titanium nitride layer; and flowing a gaseous mixture comprising titanium tetrachloride and ammonia to deposit a layer comprising titanium nitride over the titanium boronitride layer to fill the opening or repeating the foregoing steps to fill the opening.

97. A method of forming a conductive contact in an opening within a semiconductor device, the opening formed in an insulative layer and extending to an underlying silicon-comprising substrate, the opening defined by sidewalls, the method comprising the steps of:

forming a seed layer comprising titanium silicide over the substrate within the opening; and depositing alternating layers of titanium nitride and titanium boronitride to fill the opening; whereby the titanium boronitride layer comprises an amount of boron effective to adhere the conductive contact to the sidewalls of the opening and substantially eliminate peeling of the conductive contact from the sidewalls of the opening and cracking of the insulative layer, and an amount of nitrogen effective to maintain the conductivity of the contact at a predetermined level.

98. A method of forming a conductive contact in an opening within a semiconductor device, the opening formed in an insulative layer and extending to an underlying silicon-comprising substrate, the method comprising the steps of:

forming a seed layer comprising titanium silicide over the surface of the substrate within the opening by plasma enhanced chemical vapor deposition using titanium tetrachloride, hydrogen, and one or more carrier gases; and depositing alternating layers of titanium boronitride into the opening by thermal chemical vapor deposition by flowing a first gaseous mixture comprising titanium tetrachloride and ammonia to form titanium nitride layers, and a second gaseous mixture comprising titanium tetrachloride, ammonia and diborane to form one or more titanium boronitride layers;

wherein the second gaseous mixture comprises the ammonia and diborane in amounts effective to provide a level of adhesion of the conductive contact to the insulative layer along the sidewalls of the opening, to substantially eliminate peeling of the conductive contact from the sidewalls of the opening and cracking of the insulative layer, and to provide an effective level of conductivity to a conductive area in the substrate.

99. The method of claim 98, wherein the conductive area comprises a source/drain of a transistor.

100. A method of forming a conductive contact within a high aspect ratio opening through an insulative layer to an underlying silicon-comprising substrate, the opening having sidewalls, the method comprising the steps of:

flowing a gaseous mixture comprising titanium tetrachloride to deposit a layer of titanium silicide on the substrate; and flowing a gaseous mixture comprising titanium tetrachloride and ammonia, with and without diborane, to deposit alternating layers of titanium nitride and titanium boronitride material over the titanium silicide layer; wherein the titanium boronitride layer is interposed between titanium nitride layers.

101. The method of claim 100, wherein the titanium nitride layer is deposited by thermal chemical vapor deposition by flowing about 100 to about 500 sccm titanium tetrachloride and about 100 to about 1000 sccm ammonia into the opening.

102. The method of claim 100, wherein the titanium boronitride layer is deposited by thermal chemical vapor deposition by flowing about 100 to about 500 sccm titanium tetrachloride, about 100 to about 1000 sccm ammonia, and about 100 to about 1000 sccm diborane into the opening.

103. The method of claim 102, wherein the gaseous mixture to form the titanium boronitride layer comprises the diborane in an amount effective to provide the conductive contact with adherence to the sidewalls of the opening, with no substantial cracks being formed in the insulative layer.

104. The method of claim 102, wherein the gaseous mixture to form the titanium boronitride layer comprises the diborane in an amount effective to provide the conductive contact with a level of thermal stress to substantially eliminate cracking of the insulative layer.

105. The method of claim 100, wherein the gaseous mixture to form the titanium boronitride layer comprises the ammonia in an amount effective to provide an effective amount of conductivity to an active area within the substrate.

106. A method of forming a semiconductor device, comprising the steps of:
   forming an insulative layer over a silicon-comprising substrate comprising a conductive area;
   forming an opening in the insulative layer to expose the conductive area of the substrate, the opening having sidewalls;
   forming a seed layer comprising titanium silicide over the substrate within the opening; and
   forming a layer comprising titanium boronitride over the seed layer to fill the opening;
   filling the opening with alternating layers of titanium nitride and titanium boronitride material;
   wherein the titanium boronitride layer is interposed between titanium nitride layers, and the titanium boronitride layer comprises an amount of boron effective to provide the conductive contact with a level of adhesion to the insulative layer within the opening to substantially eliminate peeling of the conductive contact from the sidewalls of the opening, and a level of thermal stress to substantially eliminate cracking of the insulative layer; and an amount of nitrogen effective to maintain the conductivity of the contact at a predetermined level for an effective electrical contact with the conductive area.

107. A method for filling high aspect ratio contact openings, comprising the steps of:
   providing a substrate having a silicon-comprising substrate and an insulative layer formed thereon, the insulative layer having a surface and at least one contact opening formed therein to the substrate; the contact opening having an aspect ratio of at least about 3:1;
   forming a seed layer comprising titanium silicide over the surface of the substrate within the contact opening; and
   forming a multi-layered film over the seed layer, the film comprising a layer comprising titanium boronitride interposed between layers comprising titanium nitride.

108. The method of claim 107, further comprising, after the step of forming the multi-layered film, the step of forming additional layers of the titanium boronitride layer interposed between the titanium nitride layers to fill the opening.

109. The method of claim 107, wherein the contact opening has an aspect ratio of 3:1 or greater, and a width of about 0.25 $\mu$m or less.

110. A method of forming a conductive contact in an opening in an insulative layer overlying a substrate, comprising the steps of:
   forming a layer of titanium silicide on the substrate within the opening; and
   filling the opening with titanium boronitride to form the conductive contact.

111. A method of forming a conductive contact in an opening in an insulative layer overlying a substrate, comprising the steps of:
   forming a layer of titanium silicide on the substrate within the opening; and
   filling the opening with titanium boronitride to form the conductive contact having a thickness of about 200 angstroms or greater.

112. A method of forming a conductive contact in an opening in an insulative layer overlying a substrate, comprising the steps of:
   forming a layer of titanium silicide on the substrate within the opening; and
   filling the opening with titanium boronitride to form the conductive contact having a thickness of about 1000 to about 3000 angstroms.

113. A method of forming a conductive contact in an opening in an insulative layer overlying a substrate, comprising the steps of:
   forming a layer of titanium silicide on the substrate within the opening; and
   forming the conductive contact by depositing a gaseous mixture comprising titanium tetrachloride, ammonia and diborane into the opening.

114. A method of forming a conductive contact in an opening in an insulative layer overlying a substrate, comprising the steps of:
   forming a layer of titanium silicide on the substrate within the opening; and
   depositing a gaseous mixture comprising titanium tetrachloride, ammonia and diborane by thermal chemical vapor deposition into the opening to form the conductive contact.

115. A method of forming a conductive contact in an opening in an insulative layer overlying a substrate, the opening having insulative sidewalls, comprising the steps of:
   forming a layer of titanium silicide on the substrate within the opening; and
   depositing a gaseous mixture comprising titanium tetrachloride, ammonia and diborane within the opening to form the conductive contact;
   the gaseous mixture comprising an amount of the diborane to provide the contact with an amount of boron for effective adhesion of the contact to the insulative sidewalls of the opening to substantially eliminate peeling of the contact from the sidewalls and cracking of the insulative layer, and an amount of the ammonia to provide the contact with a level of nitrogen for an effective level of conductivity to an active area within the substrate.

116. A method of forming a conductive contact in an opening in an insulative layer overlying a substrate, the opening having insulative sidewalls, comprising the steps of:
   forming a layer of titanium silicide on the substrate within the opening; and
   depositing a gaseous mixture comprising titanium tetrachloride, ammonia and diborane within the opening to form the conductive contact, wherein the contact comprises an amount of boron for effective adhesion of the contact to the insulative sidewalls of the opening to substantially eliminate peeling of the contact from the sidewalls and cracking of the insulative layer, and an amount nitrogen for an effective level of conductivity to an active area within the substrate.

117. A method of forming a conductive contact in an opening in an insulative layer overlying a substrate, the opening having insulative sidewalls, comprising the steps of:
   forming a layer of titanium silicide on the substrate within the opening; and
   depositing a gaseous mixture comprising titanium tetrachloride, ammonia and diborane by thermal chemical vapor deposition to form a fill within the opening; the fill comprising an amount of boron for effective adhesion to the insulative sidewalls of the opening to substantially eliminate peeling of the fill from the sidewalls and cracking of the insulative layer, and an amount of nitrogen for an effective level of conductivity to an active area within the substrate.

118. A method of forming a conductive contact in an opening in an insulative layer overlying a substrate, comprising the steps of:

forming a layer of titanium silicide on the substrate within the opening;

depositing a layer of titanium nitride over the titanium silicide layer;

depositing a layer of titanium boronitride over the titanium nitride layer;

depositing a layer of titanium nitride over the titanium boronitride layer; and repeating the steps of depositing the layers of titanium nitride and titanium boronitride to fill the opening and form a multi-layered film with the titanium boronitride layer disposed between titanium nitride layers.

119. A method of forming a conductive contact in an opening in an insulative layer overlying a substrate, comprising the steps of:

forming a layer of titanium silicide on the substrate within the opening;

depositing a layer of titanium nitride over the titanium silicide layer; and sequentially depositing overlying layers of titanium boronitride and titanium nitride to form a multi-layered film with the titanium boronitride layer disposed between titanium nitride layers.

120. A method of forming a conductive contact in an opening in an insulative layer overlying a substrate, comprising the steps of:

forming a layer of titanium silicide on the substrate within the opening;

depositing a layer of titanium nitride over the titanium silicide layer;

depositing a gaseous mixture comprising titanium tetrachloride and ammonia within the opening to form a layer of titanium nitride over the titanium silicide layer;

depositing a gaseous mixture comprising titanium tetrachloride, ammonia and diborane within the opening to form a layer of titanium boronitride over the titanium nitride layer;

depositing a gaseous mixture comprising titanium tetrachloride and ammonia within the opening to form a layer of titanium nitride over the titanium boronitride layer; and repeating the steps of depositing the gaseous mixtures to form sequential layers of titanium nitride and titanium boronitride to form the conductive contact with the titanium boronitride layer disposed between titanium nitride layers.

* * * * *

UNITED STATES PATENT AND TRADEMARK OFFICE
CERTIFICATE OF CORRECTION

PATENT NO.  : 6,696,368 B2
DATED       : February 24, 2004
INVENTOR(S) : Ammar Derraa et al.

It is certified that error appears in the above-identified patent and that said Letters Patent is hereby corrected as shown below:

<u>Title page,</u>
Item [56], References Cited, U.S. PATENT DOCUMENTS, add the following:

-- 2003/0042606 A1    03/2003    Derraa
   2003/0042607 A1    03/2003    Derraa et al.
   2003/0077895 A1    03/2003    Derraa et al. --

Signed and Sealed this

Twentieth Day of April, 2004

JON W. DUDAS
*Acting Director of the United States Patent and Trademark Office*